(12) United States Patent
Cuthbert (10) Patent No.: US 6,675,313 B2
(45) Date of Patent: Jan. 6, 2004

(54) METHOD AND APPARATUS FOR REDUCING SIGNAL TIMING SKEW ON A PRINTED CIRCUIT BOARD

(75) Inventor: David Cuthbert, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/329,494

(22) Filed: Dec. 27, 2002

(65) Prior Publication Data

US 2003/0088802 A1 May 8, 2003

Related U.S. Application Data

(63) Continuation of application No. 09/384,192, filed on Aug. 27, 1999, now Pat. No. 6,526,519.

(51) Int. Cl.[7] .................................................. G06F 1/04
(52) U.S. Cl. ......................................... 713/503; 716/15
(58) Field of Search ............................ 713/503; 716/1, 716/8, 12, 15

(56) References Cited

U.S. PATENT DOCUMENTS

| | | |
|---|---|---|
| 5,260,892 A | 11/1993 | Testa |
| 5,467,040 A | 11/1995 | Nelson et al. |
| 5,507,029 A | 4/1996 | Granato et al. |
| 5,691,662 A | 11/1997 | Soboleski et al. |
| 5,861,764 A | 1/1999 | Singer et al. |
| 5,867,448 A | 2/1999 | Mann |

*Primary Examiner*—Thomas M. Heckler
(74) *Attorney, Agent, or Firm*—Dickstein Shapiro Morin & Oshinsky LLP (57) ABSTRACT

An apparatus and method are described for reducing the timing skew on a printed circuit board including a plurality of conductive traces interconnecting a first node and a second node. At least one section is removed from at least one printed circuit board trace to thereby sever a trace and prevent signals passing from the first node to the second node from following the severed trace. In this manner, signal path length can be adjusted to reduce timing skews in the circuit. Sections are removed from the traces by using a laser, CVD, a router, a plasma or by passing sufficient current through weakened areas of the traces.

19 Claims, 12 Drawing Sheets

METHOD AND APPARATUS FOR REDUCING SIGNAL TIMING SKEW ON A PRINTED CIRCUIT BOARD

This application is a continuation of application Ser. No. 09/384,192, filed on Aug. 27, 1999, now U.S. Pat. No. 6,526,519 which is hereby incorporated by reference.

BACKGROUND OF THE INVENTION

1. Field of the Invention

The present invention relates to a method and apparatus for reducing skew of signals passing through a memory module. More specifically, the present invention relates to a method and apparatus for reducing the timing skew by adjusting the length of the signal traces on a printed circuit board of the memory module.

2. Description of the Related Art

It is desirable to attempt to eliminate timing skew between signals propagating through high speed memory modules and other types of high speed integrated circuit ("IC") modules or circuits. Many techniques have been proposed, but all involve substantial costs, as well as imposing additional manufacturing limitations.

U.S. Pat. No. 5,260,892, for example, describes a method and apparatus for manufacturing an improved Dynamic Random Access Memory ("DRAM") electrical signal interconnect structure having special application to Single In-line Memory Modules ("SIMMs"). The structure contains an on-board buffer for deriving time-critical signals from a single source. The conductor structure further includes trace signal routes that allow for approximately equivalent minimum distance signal line lengths. The device further includes vias connecting the front and rear surfaces of the SIMMs, resulting in a high speed, high density SIMM with clean rising and falling edges. The conduction pattern has to be carefully designed and conditioned and is therefore relatively expensive to implement. Moreover, the conductive pattern is fixed and does not allow any type of adjustment to accommodate differences in chip or module performance.

Another method has been proposed in U.S. Pat. No. 5,507,029, which is directed toward a method for minimizing the time skew in very large scale integrated circuits. The method includes equalizing the differences between the early and late mode slack for each of the multi-cycles to decrease the probability of failure. The method further includes maximizing the timing balance between the early and late mode slack, balancing all the net differences between the early and late mode slack, minimizing the statistical variations found within the mode slack pair, and compensating for asymmetries between rising and falling switching times using the mode slack pair. However, this method is also complex and is only concerned with correcting skew between IC chips in a VLSI package, with the ICs being interconnected.

SUMMARY OF THE INVENTION

The present invention overcomes the deficiencies in the prior art by providing a method and a structure for reducing timing skew for signals, e.g. clock signals, propagating through a memory module, such as a DRAM, SRAM, or SDRAM memory module. The method is accomplished by adjusting the length of signal traces found on the printed circuit board of the memory module. The signal trace adjustment can be used to reduce timing skew of clock and other module signals, thereby increasing module timing margins and performance.

The present invention also provides for relaxed tolerances in the manufacture of memory modules, with a corresponding reduction in costs, since adjustment of timing skews can be easily accomplished.

The method of the invention includes removing at least one section from at least one printed circuit board trace interconnecting two electrical points or nodes to thereby prevent signals from following the trace and forcing the signals along other traces which interconnect the two nodes.

The apparatus formed by the above method is a printed circuit module board ("PCB") having traces formed thereon as parallel signal paths of differing lengths between two signal nodes with at least one trace being severable to force the signals passing between the two nodes along other signal path traces.

BRIEF DESCRIPTION OF THE DRAWINGS

These and other aspects, features and advantages of the present invention will become apparent to one skilled in the art to which the present invention pertains through a study of the following detailed description in conjunction with the appended drawings, all of which form a part of this specification, wherein.

DETAILED DESCRIPTION OF THE INVENTION

Illustrative embodiments of the invention and exemplary applications will now be described with reference to the accompanying drawings.

Figure 1:
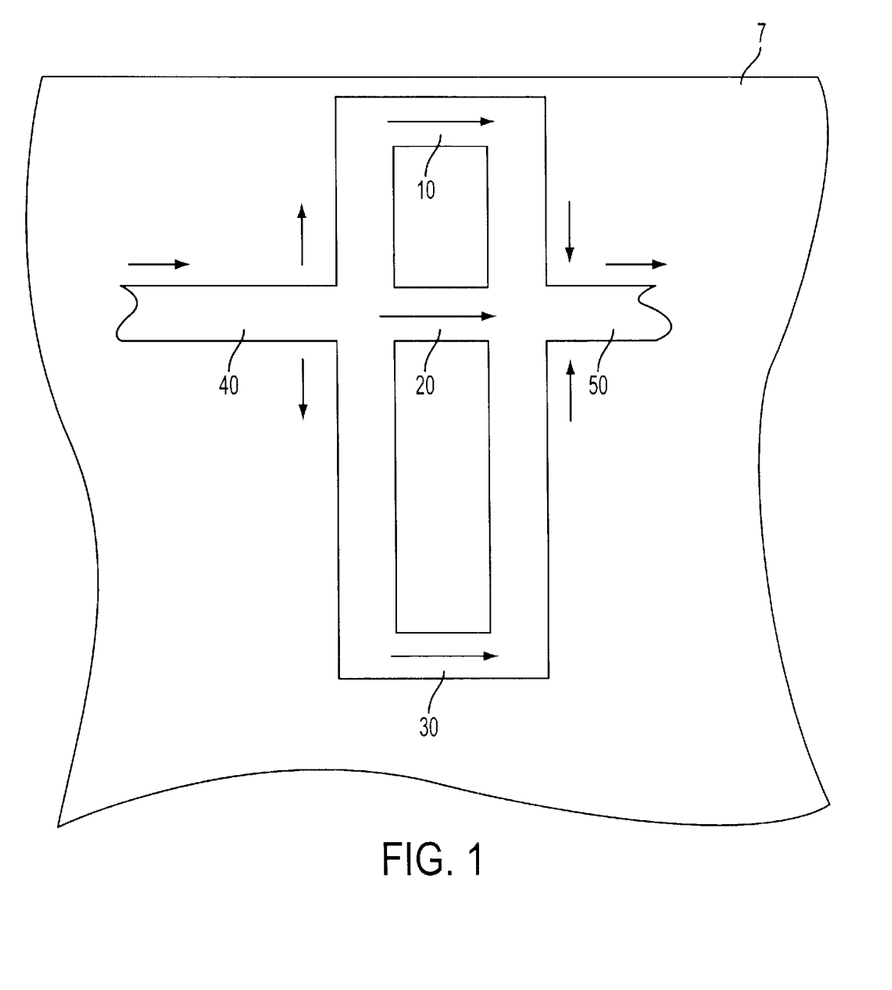
FIG. 1 is a perspective view of a portion of printed circuit board ("PCB") constructed in accordance with a first embodiment of the present invention and containing severable traces prior to skew adjustment.

FIG. 1 illustrates a portion 7 of a memory module PCB having a conductor pattern with three signal traces, 10, 20, and 30 between an input trace 40 and an output trace 50. At the outset, it should be noted that the Figures are not drawn to scale. As can be easily seen from FIG. 1, the trace lengths 10, 20, and 30 are all different lengths, with 20 being the shortest path between input trace 40 and output trace 50. Because the trace lengths are of varying lengths, it will take an electrical signal a longer time to propagate through trace 30 than through trace 10 or 20. Likewise, it will take a signal longer to propagate through trace 10 than through trace 20. In order to correct a signal arrival time (skew) at output trace 50, for example, the arrival time of a clock signal, the conductive path length is altered on the PCB to reduce or eliminate timing skew.

Figure 2:
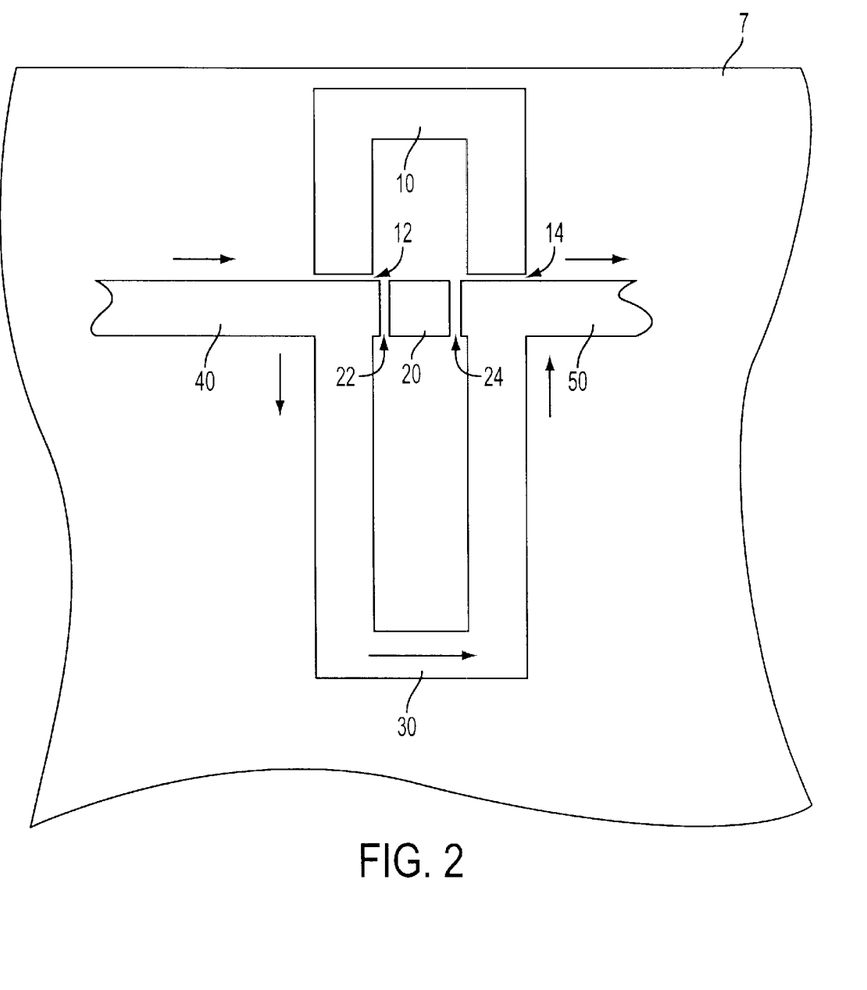
FIG. 2 illustrates the same portion of the PCB after trace length adjustment.

As depicted in FIG. 2, one or both of sections 12, 14 and one or both of sections 22, 24 can be mechanically or chemically removed from the signal traces 10 and 20, by such means as laser ablation, grinding, a plasma process or a CVD process, which rather than depositing a layer, chemically removes a conductive layer. It is also possible to mechanically remove one or more of the sections 12, 14, 22, and 24 using such equipment as a PCB router. Preferably both sections 12, 14 and 22, 24 are removed from the traces to eliminate any undesired signal reflections. This leaves the only possible path for the signal to take being along trace 30. Removing one or both of sections 12, 14 and one or both of sections 22, 24 effectively blocks the signal from traversing traces 10 and 20.

In order to determine how to adjust the PCB trace length, the amount of signal adjustment needed is determined using time domain transmission techniques. In-phase pulses are launched into a known reference trace as well as a PCB trace-under-test. Such pulses can originate from a single pulse source that includes a signal splitter to produce two identical in-phase pulses.

Figure 3:
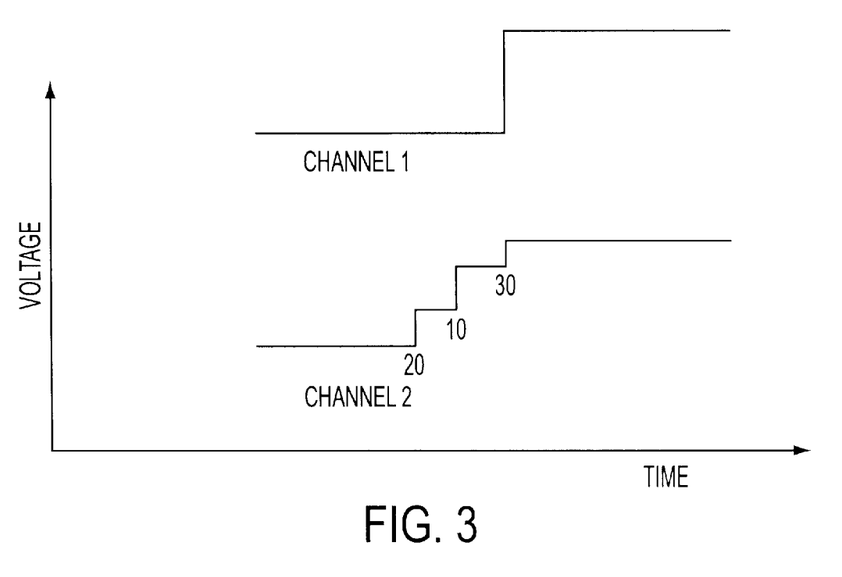
FIG. 3 is an oscilloscope display showing timing skew measurements.

FIG. 3 is a timing diagram as shown on an oscilloscope connected to an output of a reference trace path (channel 1) and a trace path on the PCB (channel 2). The channel 1 signal represents the timing signal received by an oscilloscope traveling through the reference path, while the channel 2 signal represents the same timing signal passing through the PCB traces 10, 20, and 30, respectively. As is clear from FIG. 3, when the signal being measured passes through section 30, the signal under test best matches the arrival time of the reference signal on channel 1. However, when the signal under test passes through section 20, it arrives much sooner than the reference signal. Likewise, when the signal under test passes through section 10, the signal under test also arrives sooner than the reference signal. Thus, it is clear that the longest trace 30 on the PCB produces the largest signal delay, while the shortest trace 20 produces the smallest signal delay, with the trace 10 falling in between. It is also clear that the trace 30 is the closest match to providing a signal arrival time that corresponds with the arrival of the reference signal. Thus, paths 10 and 20 should be disconnected or otherwise separated from the PCB. Such signal path adjustments can be made at the end of a series connected group of integrated circuits ("ICs") or at several points in between the serially connected ICs.

Figure 4:
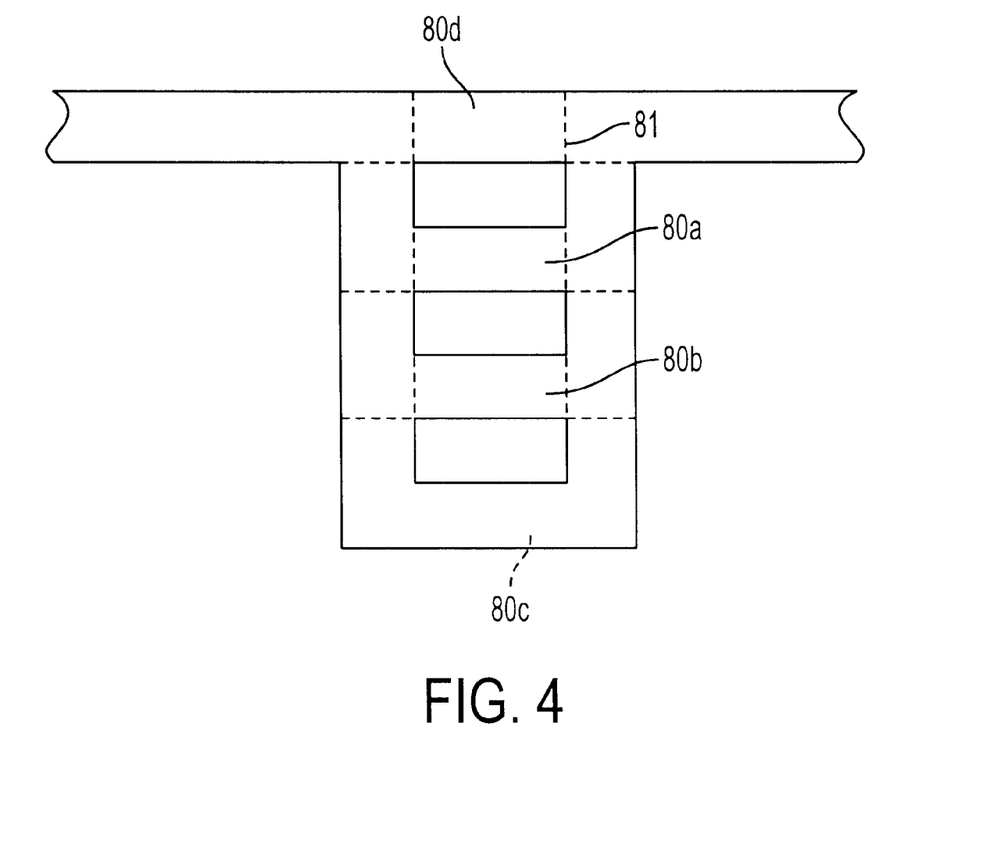
FIG. 4 is a perspective view of a PCB constructed in accordance with a second embodiment of the invention and containing severable traces thereon.

FIG. 4 illustrates a second embodiment of a PCB using ladder-like conductor patterns for signal path length adjustment and the possible sections 80 that can be removed. Those sections which can be removed are indicated by dashed lines 81. Any of the dashed lines can be removed, thus allowing the length of the finalized PCB signal path to be variable. The length is adjusted by the same methods mentioned above with reference to FIG. 3.

Figure 5:
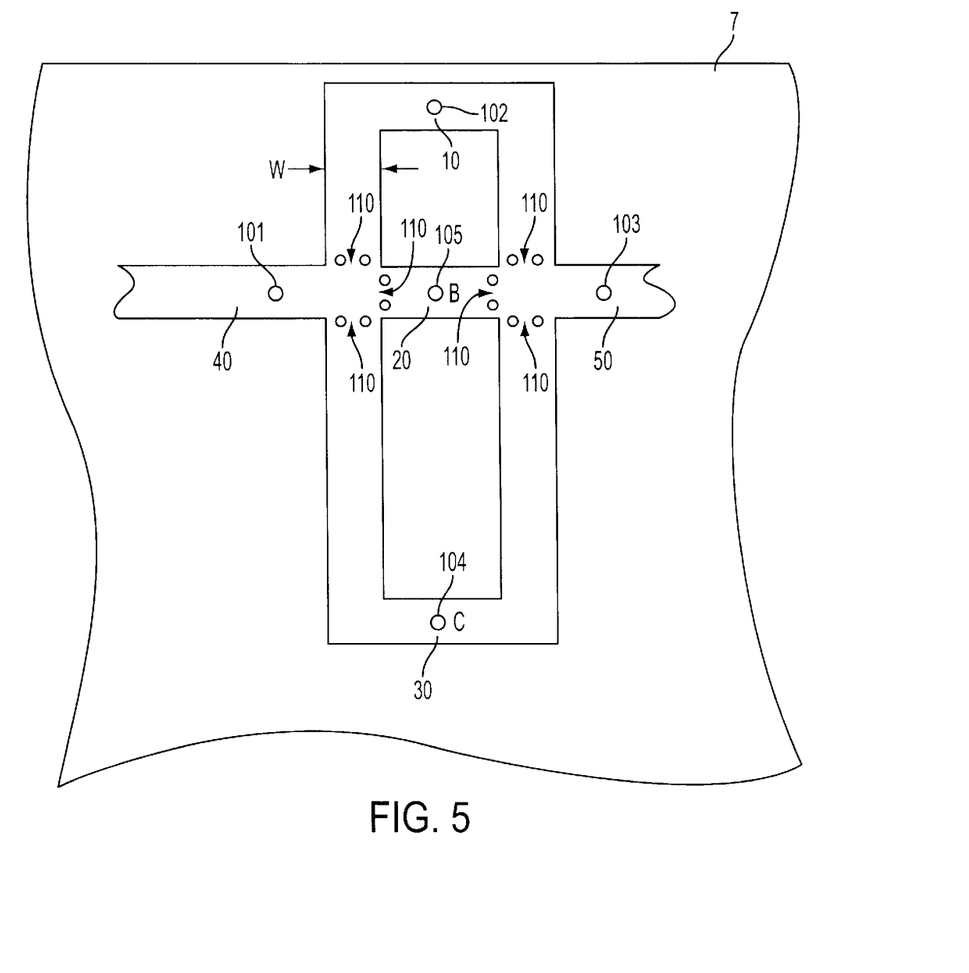
FIG. 5 illustrates a third embodiment of the present invention where fuse links are employed on a PCB as part of the severable traces.
Figure 6A:
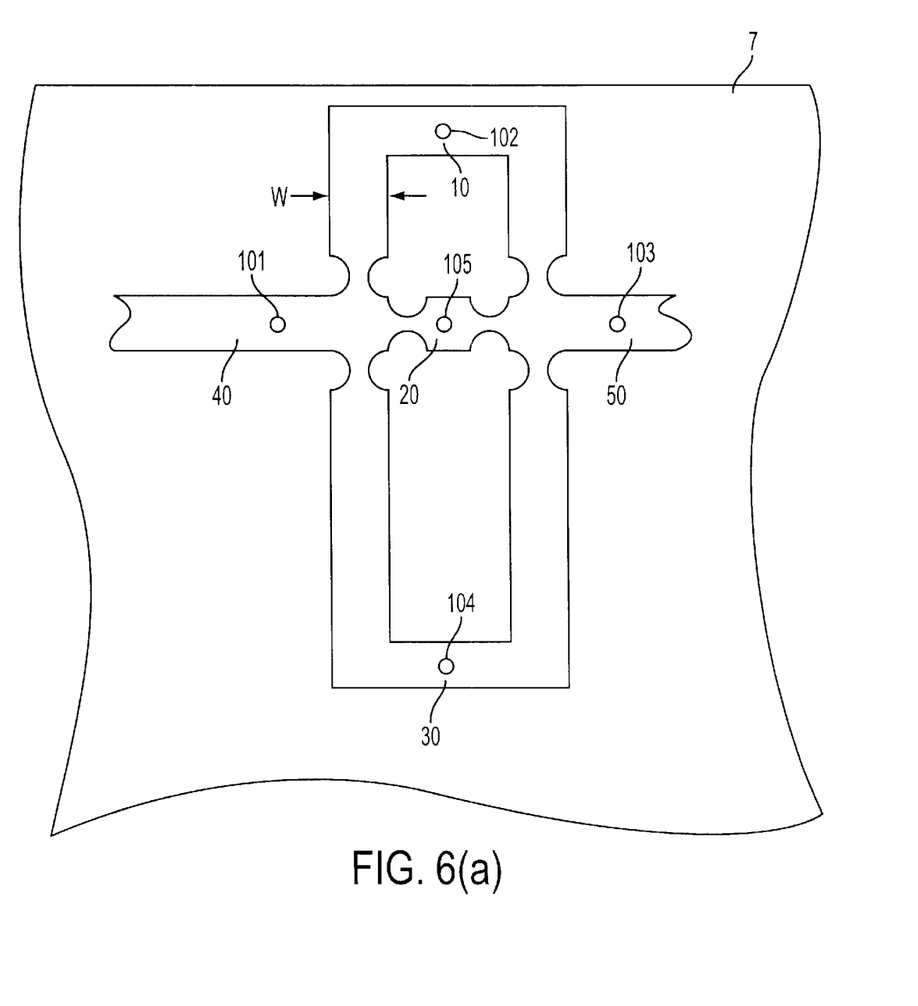
FIG. 6(a) illustrates a first modification of the third embodiment.

FIG. 5 illustrates anther method of adjusting the lengths of traces on a PCB. Here, the traces are the same as those shown in FIG. 1. However, FIG. 5 uses an electrical technique to sever the trace sections and adjust path length. At the points where PCB traces sections 12, 14, 22 and 24 (of FIG. 2) would be removed, the trace current handling cross section is reduced during PCB manufacture by drilling holes 110 in the traces, thereby reducing the effective width W (FIG. 5) of the traces and weakening them. The traces can also be reduced in width by other methods as well. For example, a trace may be reduced in width by routing out the side edges of each in the manner shown in FIG. 6(a).

Figure 6B:
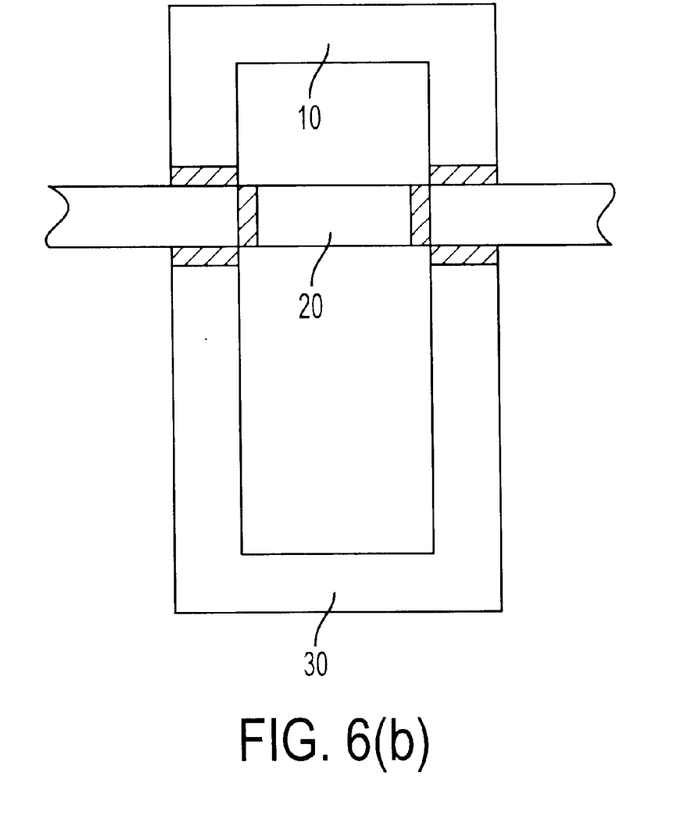
FIG. 6(b) illustrates a second modification of the third embodiment.
Figure 6C:
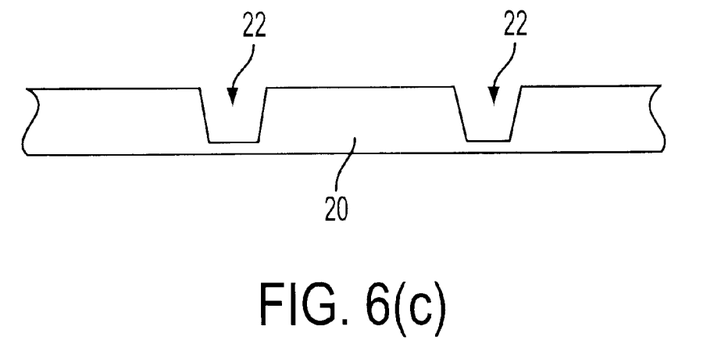
FIG. 6(c) illustrates a side view of the FIG. 6(b) modification.
Figure 6D:
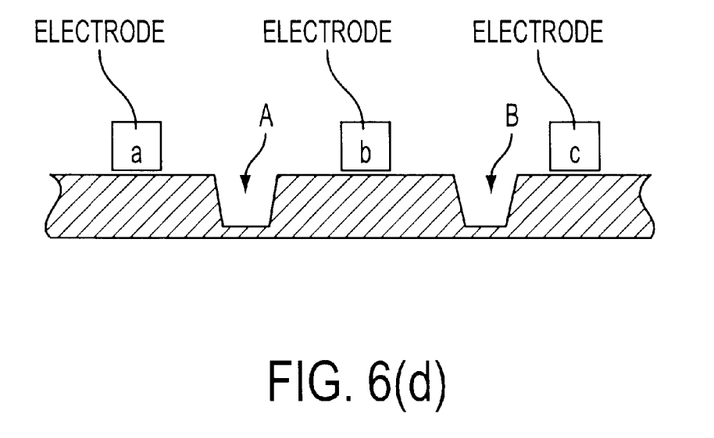
FIG. 6(d) illustrates a side view of electrodes placed on a PCB trace.

It should also be noted that the trace current handling cross section can be reduced by other methods as well. For example, referring to FIG. 6(b) a trace may be reduced in thickness by routing the surface at the points where holes 110 (of FIG. 5) might otherwise be located. FIG. 6(c) illustrates a side view of metal PCB trace 20 having reduced thickness at locations 22 and 24. The PCB trace 20 may also be reduced in thickness by chemically etching the surface. FIG. 6(d) illustrates a side view of electrodes a, b, c placed upon a PCB trace that has been reduced in thickness at selected areas A, B. For example, to fuse open section A, a suitable current is allowed to flow between electrodes a and b. Using the FIGS. 4, 5 and 6(a)–(d) techniques, a trace which is e.g., 700 micro inches thick is reduced to an effective thickness of 200 micro inches in the areas which can be removed. This produces an area that will fuse open when a suitable current flows through it.

An external device or fixture with at least two probes contacts the area shown in FIG. 5. For two probes pairs of probe points 101, 105 are respectively contacted by the probes in order to sever trace 20. The probes force a current of sufficient magnitude to flow between contact points 101 and 105 to sever trace 20 at the weakened area. Likewise, the pair of probes can be respectively connected to contact points 101, 105; 101, 102; 102, 103; 103, 105; 101, 104; and 103, 104 in order to sever the traces at the weakened areas (e.g., 12, 14, 22, 24, etc. as shown in FIG. 2). Alternatively, a probe device which has five probes which can respectively be connected with points 101, 102, 103, 104 and 105 can be used, with selective ones of the probes being energized to flow current through weakened areas as necessary to sever the traces in the manner desired. The probe current effectively blows out the weakened areas built into the traces of the PCB.

EXAMPLE

Figure 7:
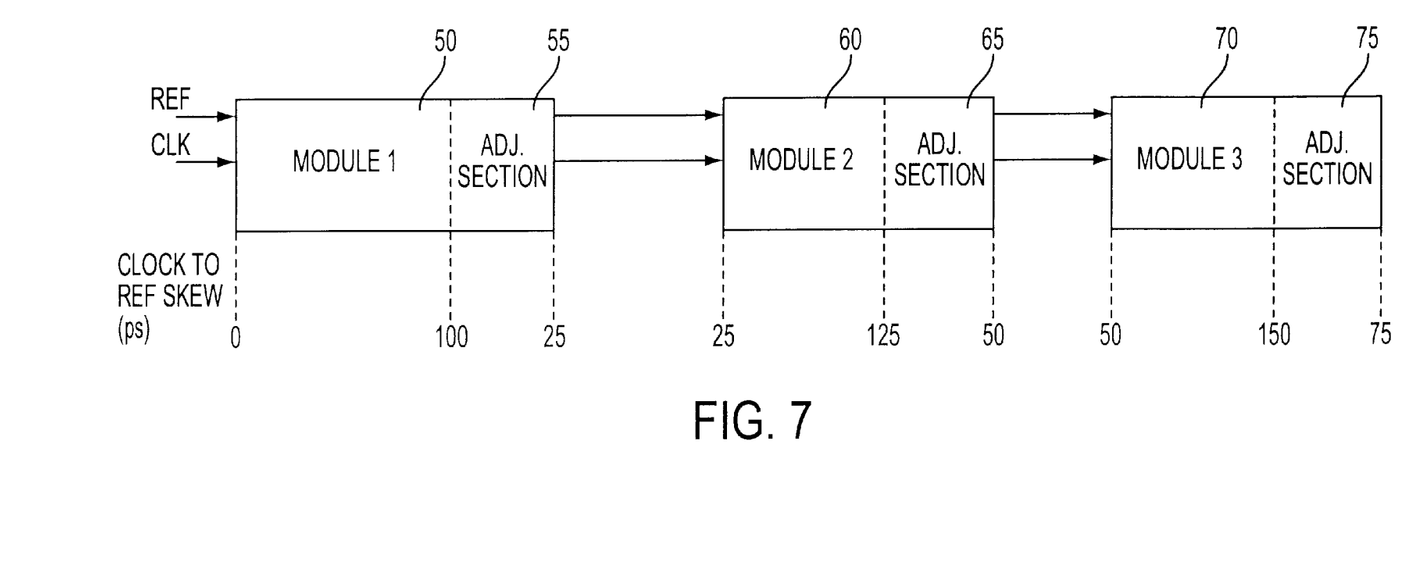
FIG. 7 illustrates several memory models connected together and a signal timing skew pattern between a reference signal and a clock signal passing therethrough.

FIG. 7 illustrates three memory modules, each containing a plurality of memory chips on a printed circuit board, which were serially interconnected to demonstrate use of the invention. The three memory modules 50, 60, 70 have a series connected clock signal. Each untuned memory module 50, 60, 70 has an inherent clock signal-to-reference signal skew of 100 ps. Thus, the three untuned memory modules have a cumulative clock signal-to-reference signal skew of 300 ps. This number increases as the number of memory modules having serially connected clock signals increases. Each memory module also is provided with a respective signal path adjustment section 55, 65, 75 corresponding to one of the embodiments shown in FIGS. 1, 2, 4, 5, or 6 at the output side thereof. The clock signals connect from the output of one memory module, i.e., module 50, to the input of another memory module, i.e., module 60.

To adjust the clock timing skew, the adjustment section 55, 65, 75 of each memory module 50, 60, 70 is adjusted as described above to minimize clock signal skew, and thus, the timing skew at the output of each respective memory module is reduced to +25 ps. The timing skew at the last DRAM in the final memory module 70 representing the cumulative total skew is thus +75 ps. Thus, the maximum cumulative skew has been reduced from 300 ps to 75 ps, an improvement of 225 ps. Using intermediate adjustments within each memory module, that is, having more traces of differing lengths the timing skew can be further reduced, if desired. The present invention is particularly suited for use in printed circuit board memory modules, for example, SIMMs and DIMMs and for DRAMs, SRAMs, and SDRAMs.

Figure 8:
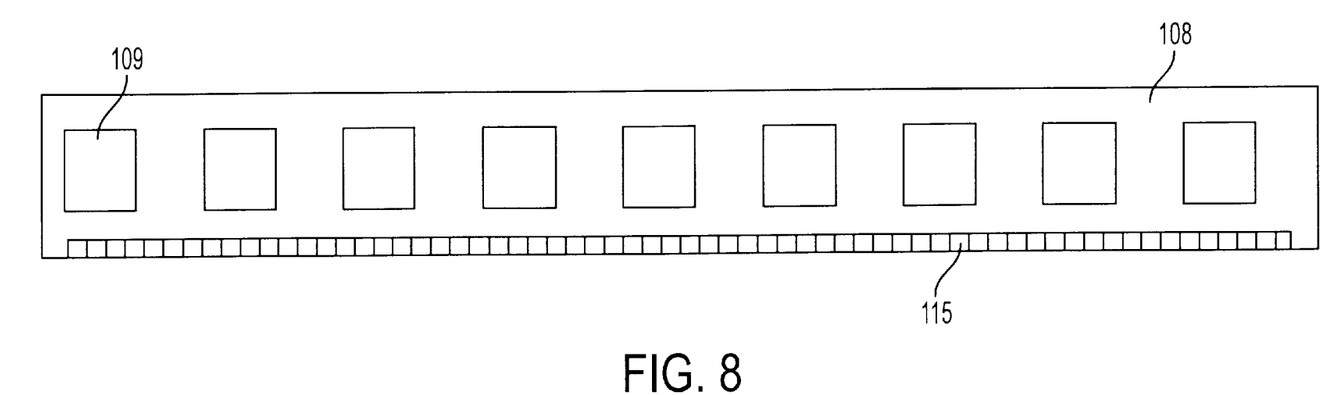
FIG. 8 illustrates a conventional DIMM that uses a PCB constructed according to the present invention.

FIG. 8 shows a conventional SIMM 102 that includes PCB 108 and data memory chips 109. An edge connector 115 connects a plurality of clock, address and data signals from an external computer to the data memory chips 109 via connecting traces on PCB 108 and the memory chips 109 themselves are connected in circuit on the PCB 108. The manner in which memory chips 109 are wired on PCB 108 is well known in the art. In the invention, the wiring pattern on PCB 108 contains conductor signal traces for the clock signal as described above with reference to FIGS. 1, 2, 4, 5, and 6.

Figure 9:
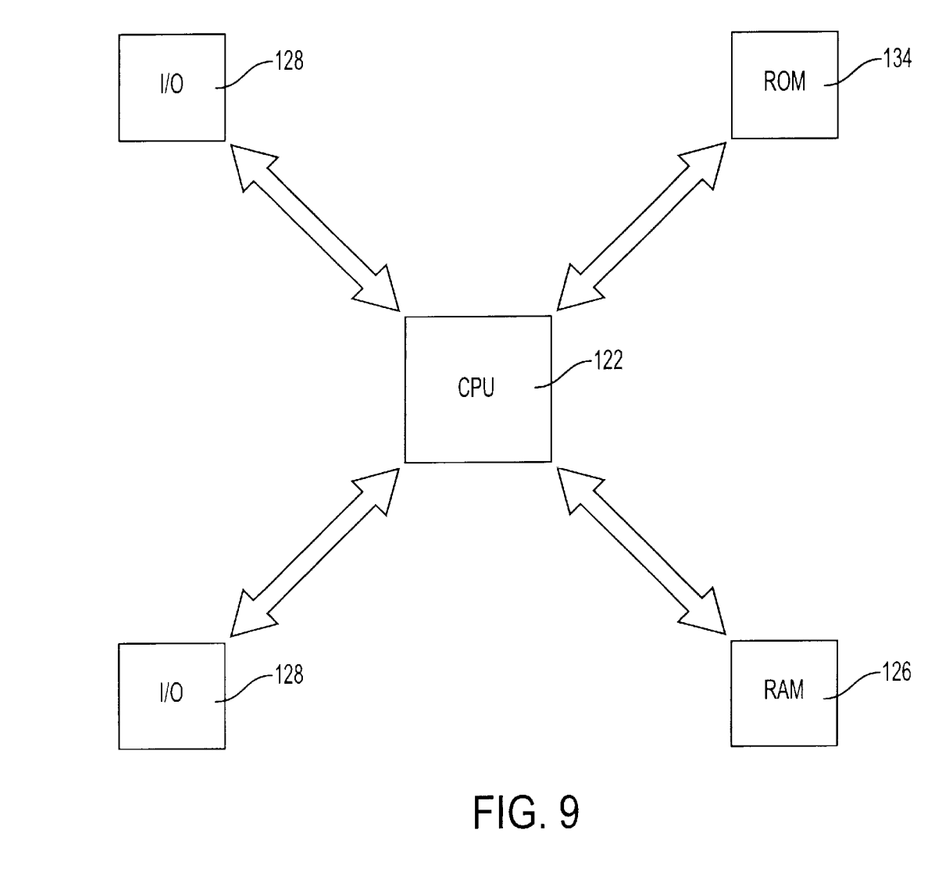
FIG. 9 illustrates a computer system employing a memory module having a PCB constructed according to the invention.

The invention has particular utility in a memory module used in a computer system, as illustrated in FIG. 9. FIG. 9 shows a processor, or CPU 122 of a computer system interconnected with a ROM 134, RAM 126, and one or more I/O ports 128 which connect with I/O devices, such as a keyboard, display, mouse, hard drive, floppy drive, etc. The RAM 126, in particular, may be formed of one or more memory modules constructed in the manner describe above in connection with FIGS. 1, 2, 4.

Figure 10:
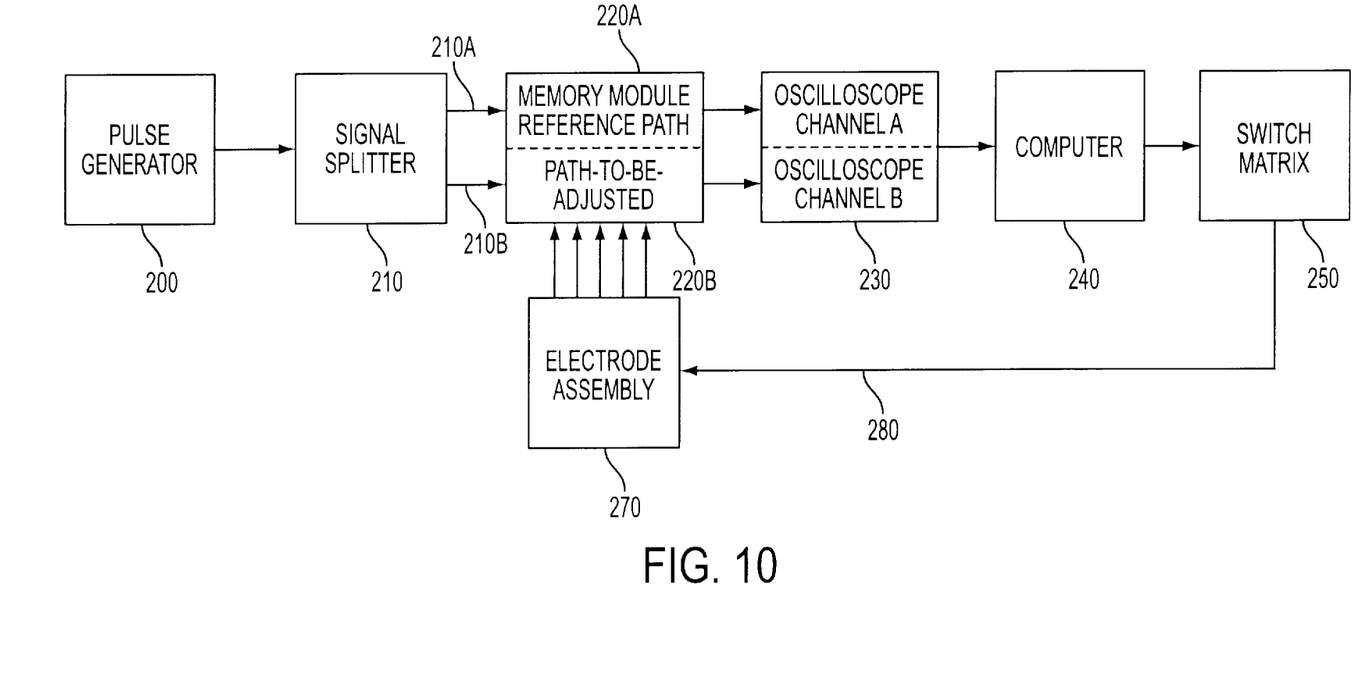
FIG. 10 illustrates a simplified block diagram of an automated system for electrically adjusting PCB trace length.

Turning now to FIG. 10, a simplified block diagram of an automated system for electrically adjusting PCB trace length is depicted. In operation, pulse generator 200 provides a signal (e.g., a square wave signal) to signal splitter 210.

Signal splitter 210 splits the signal into two in-phase signals 210A, 210B, each being equal in amplitude. Signal 210A is applied to the input of a memory module reference path 220A while signal 210B is applied to the input of a path-to-be-adjusted 220B.

A first channel (e.g., channel A) of oscilloscope 230 is coupled to the output of memory module reference path 220A. A second channel (e.g., channel B) of oscilloscope 230 is coupled to the output of the path to be adjusted 220B. A computer 240 receives the output of oscilloscope 230, whereby the relative timing difference between the signals respectively received by oscilloscope 230 channels A and B is measured. Computer 240 is configured to decide which memory module signal path is optimum and sends a relevant signal to switch matrix 250, commanding switch matrix 250 to fuse open the unneeded paths. Switch matrix 250 then sends a command signal 280 to electrode assembly 270 for actually carrying out the removal of any unneeded paths in a manner consistent with an embodiment of the invention.

As shown and described hereinabove, the present invention provides a method and apparatus for easily adjusting the timing skew of signals, for example, clock signals on a PCB by simply severing possible signal paths to thereby adjust the transversal times of signal through the PCB.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope of the invention and additional fields in which the present invention would be of significant utility.

Accordingly, the invention is not to be considered as limited by the foregoing description, but rather is limited by only the scope of the appended claims.

What is claimed is:

1. A method of reducing skew on a printed circuit board including a plurality of conductive traces interconnecting a first circuit node with a second circuit node, said method comprising:

altering the conductivity of at least one section of at least one conductive trace to thereby inhibit signals passing from said first node to said second node from following said at least one conductive trace.

2. The method according to claim 1, wherein said step of altering the conductivity includes reducing the cross-sectional area of at least one conductive trace and passing a current through said at least one conductive trace to interrupt it.

3. The method according to claim 1, wherein said step of altering the conductivity includes reducing the width of at least one conductive trace and passing a current through said at least one conductive trace to interrupt it.

4. The method according to claim 1, wherein said step of altering the conductivity includes reducing the thickness of at least one conductive trace and passing a current through said at least one conductive trace to interrupt it.

5. A method of adjusting the timing skew of a printed circuit board, said method comprising:

forming a wiring pattern on a printed circuit board having a plurality of conductive traces interconnecting a first circuit node with a second circuit node;

using a time domain transmission technique to determine the amount of signal timing adjustment that is needed in said wiring pattern between said first and second nodes; and adjusting the conductivity of at least one of said traces to set the signal arrival timing adjusted between said first and second nodes.

6. The method according to claim 5, wherein said step of using a time domain transmission technique includes connecting an oscilloscope to an output of a reference trace path and to a trace path on said printed circuit board.

7. The method according to claim 6, wherein said step of using a time domain transmission technique includes sending a current through said reference trace path and said printed circuit board path and measuring the printed circuit board path signal arrival time that corresponds with the reference signal arrival time.

8. The method according to claim 5, wherein said step of adjusting the conductivity includes reducing the cross-sectional area of at least one conductive trace and passing a current through said at least one conductive trace to interrupt it.

9. The method according to claim 5, wherein said step of adjusting the conductivity includes reducing the width of at least one conductive trace and passing a current through said at least one conductive trace to interrupt it.

10. The method according to claim 5, wherein said step of adjusting the conductivity includes reducing the thickness of at least one conductive trace and passing a current through said at least one conductive trace to interrupt it.

11. A method of eliminating signal reflections in a memory module, said method comprising:

forming at least one printed circuit board with a first circuit node and a second circuit node having a plurality of conductive traces providing different signal path lengths between said first and second nodes; and selecting at least one conductive trace to interconnect said first and second nodes by altering the conductivity path of at least another conductive trace.

12. The method according to claim 11, wherein said step of altering the conductivity path includes reducing the cross-sectional area of said another conductive trace and passing a current through said another conductive trace to interrupt it.

13. The method according to claim 11, wherein said step of altering the conductivity includes reducing the thickness of said another conductive trace and passing a current through said another conductive trace to interrupt it.

14. The method according to claim 11, wherein said step of altering the conductivity includes reducing the width of said another conductive trace and passing a current through said another conductive trace to interrupt it.

15. A memory module comprising:
at least one printed circuit board, said at least one printed circuit board having a first circuit node and a second circuit node with a plurality of conductive traces providing different signal path lengths between said first and second nodes, wherein at least one conductive trace does not provide a conductive signal path between said first and second nodes; and
at least one memory chip electrically connected to one of said first and second nodes.

16. The memory module of claim 15, wherein said at least one conductive trace has at least a portion of the conductive trace removed.

17. The memory module of claim 15, wherein said memory module is a SIMM memory module.

18. The memory module of claim 15, wherein said memory module is a DIMM memory module.

19. The memory module of claim 15, wherein said at least one conductive trace is severed.

* * * * *